United States Patent

[11] 3,605,031

[72] Inventor Ben H. Tongue
West Orange, N.J.
[21] Appl. No. 855,323
[22] Filed Sept. 4, 1969
[45] Patented Sept. 14, 1971
[73] Assignee Blonder-Tongue Laboratories, Inc.
Newark, N.J.

[54] WIDE-BAND LOW-DISTORTION ALTERNATING CURRENT AMPLIFIER
5 Claims, 1 Drawing Fig.

[52] U.S. Cl. .......... 330/30, 330/32, 333/11
[51] Int. Cl. .......... H03f 3/68, H01p 5/12
[50] Field of Search .......... 330/20, 30, 32, 124; 333/11

[56] References Cited
UNITED STATES PATENTS

| | | | |
|---|---|---|---|
| 2,782,267 | 2/1957 | Beck .......... | 330/32 X |
| 3,202,928 | 8/1965 | Prior .......... | 330/124 |
| 3,371,284 | 2/1968 | Englebrecht .......... | 330/30 X |

*Primary Examiner*—Roy Lake
*Assistant Examiner*—Lawrence J. Dahl
*Attorney*—Rines and Rines

ABSTRACT: This disclosure deals with a wide-band low-distortion alternating current amplifier employing input and output hybrid couplers interconnected by two paths, one containing a grounded collector transistor circuit and the other a grounded base transistor circuit, or similar functioning circuits as employed with other types of electron relay devices.

PATENTED SEP 14 1971 3,605,031
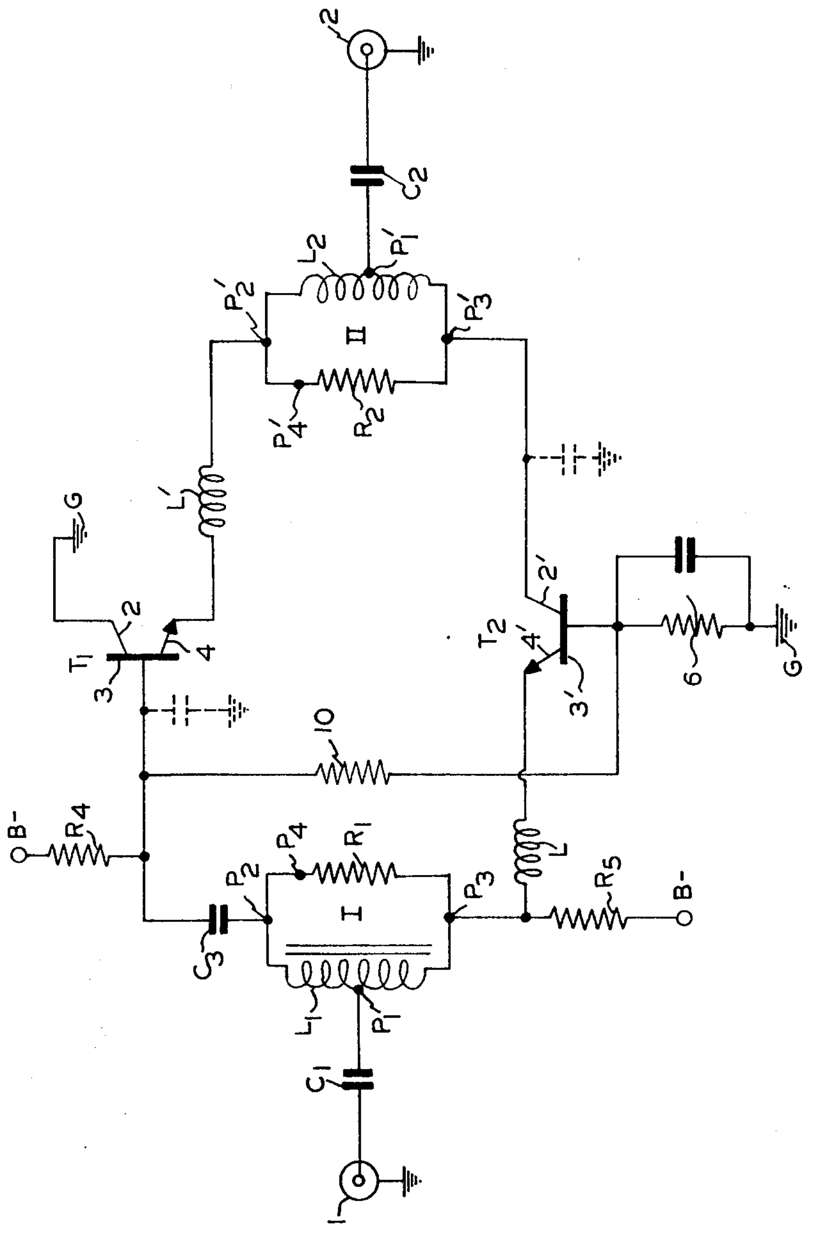
INVENTOR
BEN H. TONGUE
BY Rines and Rines
ATTORNEYS

WIDE-BAND LOW-DISTORTION ALTERNATING CURRENT AMPLIFIER

The present invention relates to wide-band low-distortion alternating current amplifiers being more particularly directed to amplifiers useful in the radiofrequency range including the VHF and UHF television bands, though being more generally applicable also to video and audiofrequency ranges and other alternating current frequency bands, as well.

Numerous techniques have been employed throughout the years to provide wide-band, relatively low-distortion radiofrequency power amplifiers, such as for use at VHF television frequencies and the like, through the use of couplers having multiple isolated ports and amplifiers connected with those ports to provide output power levels greater than that of one amplifier. Included in such devices, for example, are hybrid balanced transmission line systems of the type described in my prior U.S. Pat. No. 2,776,408.

Particularly with the advent of transistor-type electron relays, arrays of transistor amplifiers and couplers have been proposed for attaining this type of result. Among the more successful of such apparatus are those employing quadrature couplers with emitter-follower amplifier configurations interconnecting the same, having high level of broadband performance owing to the large self-degeneration of the emitter-follower configuration and enabling a high multiplicity of paralleled transistors to yield both power and return loss capabilities, together with a feed-forward system for noise cancellation and distortion reduction.

Unfortunately, however, the use of quadrature hybrids of the distributed line type has proven to be impractical for such applications as the low television bands and video circuits and the like in view of the physical size of the same; whereas the attempt to employ lumped parameters in such quadrature hybrid circuits involves disadvantageous highly critical adjustments of parameters. In additions, such circuits are not inherently adapted for push-pull operation without the adding of transformers or the like. Such circuits, moreover, normally cancel some third order distortion, but unless 180° phase-shifting devices are inserted in the input of one of the grounded emitter circuits and in the output of the other, will not provide for the cancellation of second order frequencies and the distortion produced thereby.

Other proposals using the grounded emitter configuration operate on the beta cutoff characteristic of the transistors which controls the band-pass, so that compensation devices are required to compensate for the 6 db. per octave slope inherent in the beta cutoff characteristic. While such circuits do have some inherent self-degeneration from the collector-base feedback capacitance, this is not sufficient to prevent the gain from varying with variations in supply voltage and other parameters—a highly disadvantageous result.

In accordance with the present invention, on the other hand, it has been found possible to eliminate the above-mentioned disadvantages of such prior circuits as guadrature hybrid grounded emitter amplifiers and the like and at the same time, to attain further desirable features that cannot easily be obtained with such circuits and certainly are not feasible at the lower alternating current frequencies.

An object of the invention, accordingly, is to provide a new and improved wide-band low-distortion alternating current amplifier that shall not be subject to the above-described limitations but that, to the contrary, is adapted for the lower radiofrequencies as well as higher frequencies, provides inherently a push-pull effect enabling even order harmonic cancellation, automatically provides input and output impedance matching for identical transistors and for transistors of the same polarity, enables simple DC series connection thereof, and is not dependent upon the beta cutoff characteristic of the transistor amplifiers, but employs the higher frequency alpha cutoff characteristic to advantage.

A further object is to provide a new and improved electron relay hybrid coupler wide-band amplifier circuit of more general utility, as well. In summary, the above ends are attained through the use of input and output hybrid couplers interconnected by a grounded collector transistor circuit in one path and a grounded base transistor circuit in the other path.

While the invention will be described in terms of transistor amplifiers having base, collector and emitter electrodes, it will be evident to those skilled in the art that other types of electron or amplifier devices, including field effect devices and electron tubes having cathode, grid and plate electrodes, may be similarly employed, and that the illustration of the invention in terms of the collector and base electrodes of the transistor is intended to embrace, also, the equivalent electrodes of electron tubes or similar types of electron relay devices such amplifier device electrodes being generically referred to as a pair of principal electrodes and a control electrode. While, furthermore, the term "ground" or "grounded" is employed in the specification and claims herein, this is intended to indicate either actual earthing or other reference potential, including the common potential of the input and output circuits. Thus, a "collector" or "grounded base" is intended to embrace a common collector or other similar electrode connection and a common base or similar electrode connection.

The invention will now be described with reference to the accompanying drawing, the single FIGURE of which is a schematic circuit diagram illustrating the essential preferred features of the invention, but eliminating many of the customary circuit refinements that are not necessary for an understanding of the invention or for the basic performance of the same.

Referring to the drawing, a pair of hybrid couplers is shown at I and II, comprising respective intermediately tapped coils $L_1$ and $L_2$, the intermediate tap ports $P_1$ of which are respectively shown serving as input and output ports to the hybrid couplers and being respectively connected through capacitors $C_1$ and $C_2$ to the input transmission line 1 of the amplifier system and the output transmission line 2, illustrated in coaxial form. Clearly other sources of input and output alternating current energy may be employed. The hybrid couplers I and II are of the lumped constant type having respective isolated ports $P_2$–$P_3$ and $P_2'$–$P_3'$ which are shown at the upper and lower end of the hybrid couplers I and II in the drawing. The fourth port of each hybrid coupler ($P_4$, $P_4'$ is shown terminated by respective resistors $R_1$ and $R_2$ later described. The upper ports $P_2$ and $P_2'$ of the pairs of isolated ports $P_2$–$P_3$ and $P_2'$–$P_3'$ of the respective input and output hybrid couplers I and II are respectively coupled or connected together in an upper path containing a capacitor $C_3$ and a grounded collector transistor relay $T_1$. The collector 2 of the transistor $T_1$ is illustrated as connected to ground G, whereas the base 3 thereof is connected through capacitor $C_3$ to port $P_2$, with the emitter 4 being connected to the port $P_2'$ of the output hybrid coupler II.

In somewhat similar fashion the lower port $P_3$ of the input hybrid coupler I and the lower port $P_3$ of the coupler II are coupled or interconnected by a path including the emitter electrode 4′ of a similar transistor $T_2$ which is of the same polarity as that of the transistor $T_1$ and is preferably substantially matched thereto, and the base 3′ of which is shown grounded through the RC decoupling network 6, and the collector 2′ of which is shown connected to the lower port $P_3'$ of the output hybrid coupler II. Supply voltage B− is respectively supplied through resistors $R_4$ and $R_5$ to the base electrode 3 of the transistor $T_1$and the emitter electrode 4′ of the transistor $T_2$. The base 3 of $T_1$ is connected to the base 3′ of $T_2$ through resistor 10.

In view of the fact that the hybrid couplers I and II are in-phase couplers (or180° out of phase) and not the quarter-wave transmission lines required in many of the prior art circuits, as before discussed, the device is enabled to be constructed of lumped circuit elements having no tuning or other critical adjustments whatsoever. Since, moreover, the grounded collector and grounded base circuits $T_1$ and $T_2$ are employed in the port-connecting paths, the circuit, unlike the aforementioned prior art devices, is inherently a push-pull type of circuit providing even order harmonic cancellation; and, through the hybrid couplers I and II, providing substantially perfect input and output impedance match with isolated ports. This type of circuit provides inverse feedback and gain of approximately 6 db. with low distortion. Uniform flat band-pass response is attained and without critical tuning or other adjustments, since the above circuit employs the alpha cutoff characteristic of the transistors to control the high-end fall off instead of the beta characteristic. The alpha cutoff characteristic, of course, is substantially flat to well above the beta cutoff, even though it also has a 6 db. per octave slope (above its own cutoff).

The resistors $R_1$ and $R_2$ connected to the fourth ports of the input and output couplers I and II are adjusted together with the other circuit parameters such as to be substantially four times the respective input and output impedances of the input and output couplers I and II at respective input port $P_1$ and output port $P_1'$. The adjustment of the values of resistors $R_1$ and $R_2$ also is effected to provide a resistance value that is substantially twice the square root of the product of the effective input impedances of the grounded collector stage $T_1$ and the grounded base transistor stage $T_2$. In order to attain this end, further impedance elements, such as, for example, the inductances L and L' are respectively connected in the input and output circuits of the respective transistors $T_2$ and $T_1$ to compensate for stray output capacitance (shown dotted to the right of 2') and inherent base-to-ground capacitance (shown dotted to the left of 3), respectively, such as to provide the required product of input impedances for the purposes described above. If L and L' represent stray series inductances, then the dotted capacitors are employed for the same product purposes.

In a typical circuit involving operation over the VHF television band, for example, the transistors $T_1$ and $T_2$ may be of the type TIX 39; the coils $L_1$ and $L_2$of the hybrid couplers I and II may be four total turns through ferroxide beads about a tenth of an inch in diameter; the bias resistor of the coupling network 6 and resistors 10 and $R_4$ may have respective values of 1.8 K, 2.2 K and 1.5 K to establish collector base voltages of approximately 8½ volts; and the emitter resistor $R_5$ may have a value of 100 ohms to establish an emitter current of approximately 50ma. With such parameters it has been found in practice that the band-pass is substantially flat over the television band from below 30 MHz. to 250 MHz. at a gain ranging from about 5½ db. at the low end to about 6 db. at the high end in a very smooth, tapered fashion. The output capability (with undetectable distortion) when handling three low band TV channels and three high band TV channels was found to be in the vicinity of about 1 volt per channel.

If more than 6 db. gain is desired, impedance transformers may be inserted at the emitters of each transistor to prevent a lower impedance thereto, though somewhat more distortion and somewhat less gain independence of power supply variations is achieved.

Further modifications will occur to those skilled in the art and all such are considered to fall within the spirit and scope of the invention as defined in the appended claims.

What is claimed is:

1. A wide-band low-distortion alternating current amplifier system having, in combination, input and output hybrid couplers provided with respective input and output ports and each having a pair of isolated ports, each of said couplers being of the in-phase or 180° out-of-phase type, grounded collector transistor means coupling one of the input coupler isolated ports to one of the output coupler isolated ports, and grounded base transistor means coupling the other of the pair of input isolated coupler ports to the other of the pair of output isolated coupler ports.

2. An amplifier system as claimed in claim I and in which said couplers comprise lumped constant hybrid circuits each having a forth port terminated in resistance substantially four times the respective input and output impedances of the input and output couplers and substantially twice the square root of the product of the input impedances of the grounded collector and grounded base transistor means.

3. An amplifier system as claimed in claim 2 and in which impedance elements are connected in the input of one of the transistor means and the output of the other transistor means to adjust the said input impedances to produce said product.

4. A wide-band low-distortion alternating current amplifier system having in combination, input and output hybrid couplers provided with respective input and output ports and each having a pair of isolated ports, each of said couplers being of the in-phase or 180° out-of-phase type, a pair of similar amplifying devices including a pair of principal electrodes and a control electrode, one of said devices having its control electrode grounded and its principal electrodes coupling one of the input coupler isolated ports to one of the output coupler isolated ports, and the other of the pair of devices having one of its principal electrodes grounded and having its control electrode and the other principal electrode coupling the other of the pair of input coupler isolated ports to the other of the pair of output coupler isolated ports.

5. 5. An amplifier system as claimed in claim 1 and in which said transistor means are driven in push-pull from the input coupler, providing even order harmonic cancellation at the output coupler.